US011850684B2

(12) United States Patent
Mehkri et al.

(10) Patent No.: US 11,850,684 B2
(45) Date of Patent: Dec. 26, 2023

(54) WAVE SOLDER PALLETS FOR OPTIMAL SOLDER FLOW AND METHODS OF MANUFACTURING

(71) Applicant: FLEX LTD, Singapore (SG)

(72) Inventors: Zohair Mehkri, San Jose, CA (US); Anwar Mohammed, San Jose, CA (US); Jesus Tan, San Jose, CA (US); David Geiger, Dublin, CA (US); Murad Kurwa, San Jose, CA (US)

(73) Assignee: FLEX LTD, Singapore (SG)

( * ) Notice: Subject to any disclaimer, the term of this patent is extended or adjusted under 35 U.S.C. 154(b) by 652 days.

(21) Appl. No.: 16/787,177

(22) Filed: Feb. 11, 2020

(65) Prior Publication Data

US 2020/0180059 A1 Jun. 11, 2020

Related U.S. Application Data

(62) Division of application No. 15/807,125, filed on Nov. 8, 2017, now Pat. No. 10,737,344.

(Continued)

(51) Int. Cl.
| | |
|---|---|
| *B23K 3/08* | (2006.01) |
| *H05K 3/34* | (2006.01) |
| *B33Y 50/02* | (2015.01) |
| *B33Y 80/00* | (2015.01) |
| *B29C 64/393* | (2017.01) |
| *B23K 1/08* | (2006.01) |

(Continued)

(52) U.S. Cl.
CPC ............... *B23K 3/08* (2013.01); *B23K 1/085* (2013.01); *B23K 3/0653* (2013.01); *B23K 3/087* (2013.01); *B29C 64/106* (2017.08);
*B29C 64/112* (2017.08); *B29C 64/393* (2017.08); *B33Y 50/02* (2014.12); *B33Y 80/00* (2014.12); *H05K 3/3447* (2013.01); *H05K 3/3468* (2013.01); *H05K 13/0465* (2013.01); *B29L 2031/3425* (2013.01); *B29L 2031/7178* (2013.01); *B33Y 10/00* (2014.12); *H05K 2203/0165* (2013.01); *H05K 2203/0173* (2013.01); *H05K 2203/044* (2013.01)

(58) Field of Classification Search
None
See application file for complete search history.

(56) References Cited

U.S. PATENT DOCUMENTS

| | | | | |
|---|---|---|---|---|
| 4,030,717 A | * | 6/1977 | Serlovsky | .......... H05K 13/0069 269/118 |
| 4,529,116 A | * | 7/1985 | Gutbier | ................ H05K 3/3468 228/103 |

(Continued)

*Primary Examiner* — Devang R Patel
(74) *Attorney, Agent, or Firm* — WEBER ROSSELLI & CANNON LLP

(57) ABSTRACT

A method of manufacturing a pallet for use during manufacture of a printed circuit board assembly includes determining optimal solder flow for establishing connections between lead pins of a plurality of pin-through-hole components arranged on a circuit board, designing a pallet to include geometries configured to provide the optimal solder flow when the pallet, supporting the circuit board thereon, is passed through a wave solder machine, and creating the pallet based on the design. Pallets configured for optimal solder flow and methods of manufacturing printed circuit board assemblies using such pallet are also provided.

5 Claims, 5 Drawing Sheets

Related U.S. Application Data

(60) Provisional application No. 62/418,889, filed on Nov. 8, 2016.

(51) Int. Cl.
| | |
|---|---|
| *B29C 64/106* | (2017.01) |
| *B29C 64/112* | (2017.01) |
| *B23K 3/06* | (2006.01) |
| *H05K 13/04* | (2006.01) |
| B33Y 10/00 | (2015.01) |
| B29L 31/34 | (2006.01) |
| B29L 31/00 | (2006.01) |

(56) References Cited

U.S. PATENT DOCUMENTS

| | | | | |
|---|---|---|---|---|
| 4,739,919 A | * | 4/1988 | Van Den Brekel | H05K 3/3468 228/180.1 |
| 5,292,055 A | * | 3/1994 | Gileta | B23K 3/0653 228/180.1 |
| 5,454,505 A | * | 10/1995 | Kearns | B23K 3/087 118/406 |
| 5,617,990 A | * | 4/1997 | Thompson, Sr. | B23K 3/0653 228/180.1 |
| 5,775,568 A | * | 7/1998 | Asla | B23K 3/08 228/180.1 |
| 5,820,013 A | * | 10/1998 | Ortiz | B23K 3/0653 228/43 |
| 6,119,915 A | * | 9/2000 | Thompson, Sr. | B23K 3/0676 228/56.5 |
| 6,145,729 A | * | 11/2000 | Thompson, Sr. | H05K 3/3468 228/180.1 |
| 6,164,636 A | | 12/2000 | Taylor | |
| 6,237,832 B1 | * | 5/2001 | Chung | B23K 3/087 228/43 |
| 7,229,000 B2 | * | 6/2007 | Wang | B23K 3/0653 228/49.5 |
| 2004/0222269 A1 | * | 11/2004 | Luo | B23K 3/0653 228/49.1 |
| 2005/0038641 A1 | | 2/2005 | Okamoto et al. | |
| 2008/0142568 A1 | * | 6/2008 | Reed | H05K 3/3452 264/319 |
| 2010/0038824 A1 | * | 2/2010 | Reed | H05K 3/3468 264/331.18 |
| 2014/0367519 A1 | | 12/2014 | Goehlich | |

* cited by examiner

WAVE SOLDER PALLETS FOR OPTIMAL SOLDER FLOW AND METHODS OF MANUFACTURING

CROSS-REFERENCE TO RELATED APPLICATIONS

This application is a divisional of U.S. patent application Ser. No. 15/807,125, entitled "WAVE SOLDER PALLETS FOR OPTIMAL SOLDER FLOW AND METHODS OF MANUFACTURING" and filed on Nov. 8, 2017, which claims the benefit of, and priority to, U.S. Provisional Patent Application No. 62/418,889, entitled "WAVE SOLDER PALLETS WITH COMPLEX GEOMETRY FOR OPTIMAL SOLDER FLOW USING 3D PRINTING" and filed on Nov. 8, 2016, the entire contents of which are hereby incorporated herein by reference.

TECHNICAL FIELD

The present disclosure relates to Printed Circuit Board Assemblies (PCBAs) and, more specifically, to wave solder pallets and methods of manufacturing to facilitate optimal solder flow during the wave soldering phase of PCBA manufacture.

BACKGROUND

The process flow for manufacturing PCBAs including pin-through-hole (PTH) components includes, among other steps, PTH component placement and wave soldering, wherein the circuit board being manufactured is passed through a wave soldering machine that exposes the underside of the circuit board to an upwelling, e.g., a standing wave, of molten solder such that solder is applied to permanently connect the PTH components to the circuit board.

Wave solder pallets are utilized during wave soldering to support the circuit board being manufactured. However, current wave solder pallets are subject to wear, which may result in heath and performance issues, and are unable to be manufactured with complex geometries, which limits the ability of these current wave solder pallets to control solder flow. Without the ability to control solder flow, issues such as solder clogging, too fast or too slow solder flow, and/or uneven solder flow may result.

It would therefore be desirable to reduce wear-related health and performance issues exhibited by current wave solder pallets, and to have the ability to form complex geometries on and/or within wave solder pallets to enable optimization of solder flow, thus ensuring that appropriate connections are reliably made.

SUMMARY

The present disclosure provides wave solder pallets and methods of manufacturing that minimize costs, reduce wear-related health and performance issues, and are capable of being formed with complex geometries to enable optimization of solder flow. These and other aspects and features of the present disclosure are detailed below. To the extent consistent, any of the aspects and features described herein may be used in conjunction with any or all of the other aspects and features described herein.

A method of manufacturing a pallet for use during manufacture of a printed circuit board assembly includes determining optimal solder flow for establishing connections between lead pins of a plurality of pin-through-hole components arranged on a circuit board, designing a pallet to include geometries configured to provide the optimal solder flow when the pallet, supporting the circuit board thereon, is passed through a wave solder machine, and creating the pallet based on the design.

In an aspect of the present disclosure, the optimal solder flow is where correct amounts of solder are applied in correct locations and for correct durations to establish the connections between the lead pins of the plurality of pin-through-hole components arranged on the circuit board.

In another aspect of the present disclosure wherein the optimal solder flow is determined based upon microfluidics of solder flow.

In another aspect of the present disclosure, the optimal solder flow is determined based upon speed, acceleration, volume, and direction of solder flow.

In still another aspect of the present disclosure, designing the pallet includes creating a digital model file of the pallet. The method, in such aspects, may further include simulating solder flow with the digital model file of the pallet to ensure that the simulated solder flow is the optimal solder flow.

In yet another aspect of the present disclosure, creating the pallet includes 3D printing the pallet from the digital model file of the pallet.

In still yet another aspect of the present disclosure, designing the pallet to include geometries includes designing the pallet to include at least one opening and at least one of a channel, a tunnel, or a ramp feeding into at least one of the openings. Alternatively or additionally, designing the pallet to include geometries includes designing the pallet to include at least one opening and at least one of an adjustable component or a replaceable component feeding into at least one of the openings.

A method of manufacturing a printed circuit board assembly provided in accordance with the present disclosure includes providing a circuit board, supporting the circuit board on a pallet including geometries configured to achieve optimal solder flow, positioning a plurality of components on the circuit board such that lead pins of the components extend through the circuit board and protrude from an underside of the circuit board and at least partially through at least one opening defined within the pallet, and passing the pallet through a wave solder machine such that molten solder contacts the pallet and the geometries of the pallet control the molten solder to flow according to the optimal solder flow to establish connections between the lead pins.

In an aspect of the present disclosure, the optimal solder flow is where correct amounts of solder are applied in correct locations and for correct durations to establish the connections between the plurality of lead pins.

In another aspect of the present disclosure, the optimal solder flow is determined based upon microfluidics of solder flow.

In yet another aspect of the present disclosure, the optimal solder flow is determined based upon speed, acceleration, volume, and direction of solder flow.

In still another aspect of the present disclosure, the geometries of the pallet include at least one of a channel, a tunnel, or a ramp feeding into at least one of the openings. Additionally or alternatively, the geometries of the pallet include at least one of an adjustable component or a replaceable component feeding into at least one of the openings.

A pallet for use during manufacture of a printed circuit board assembly provided in accordance with the present disclosure includes an inner body configured for positioning on an underside of a circuit board. The inner body defines at least one opening configured to receive a plurality of lead pins of components mounted on the circuit board. The inner body defines geometries feeding into the at least one opening and configured to achieve optimal solder flow to establish connections between the plurality of lead pins.

In an aspect of the present disclosure, the geometries of the pallet include at least one of a channel, a tunnel, or a ramp feeding into at least one of the openings. Additionally or alternatively, the geometries of the pallet include at least one of an adjustable component or a replaceable component feeding into at least one of the openings.

In another aspect of the present disclosure, the pallet is formed from a high temperature grade plastic via 3D printing.

In another aspect of the present disclosure, the pallet further includes an outer frame surrounding the inner body.

BRIEF DESCRIPTION OF THE DRAWINGS

Various aspects and features of the present disclosure are described hereinbelow with reference to the drawings wherein like numerals designate identical or corresponding elements in each of the several views and.

DETAILED DESCRIPTION

Figure 1:
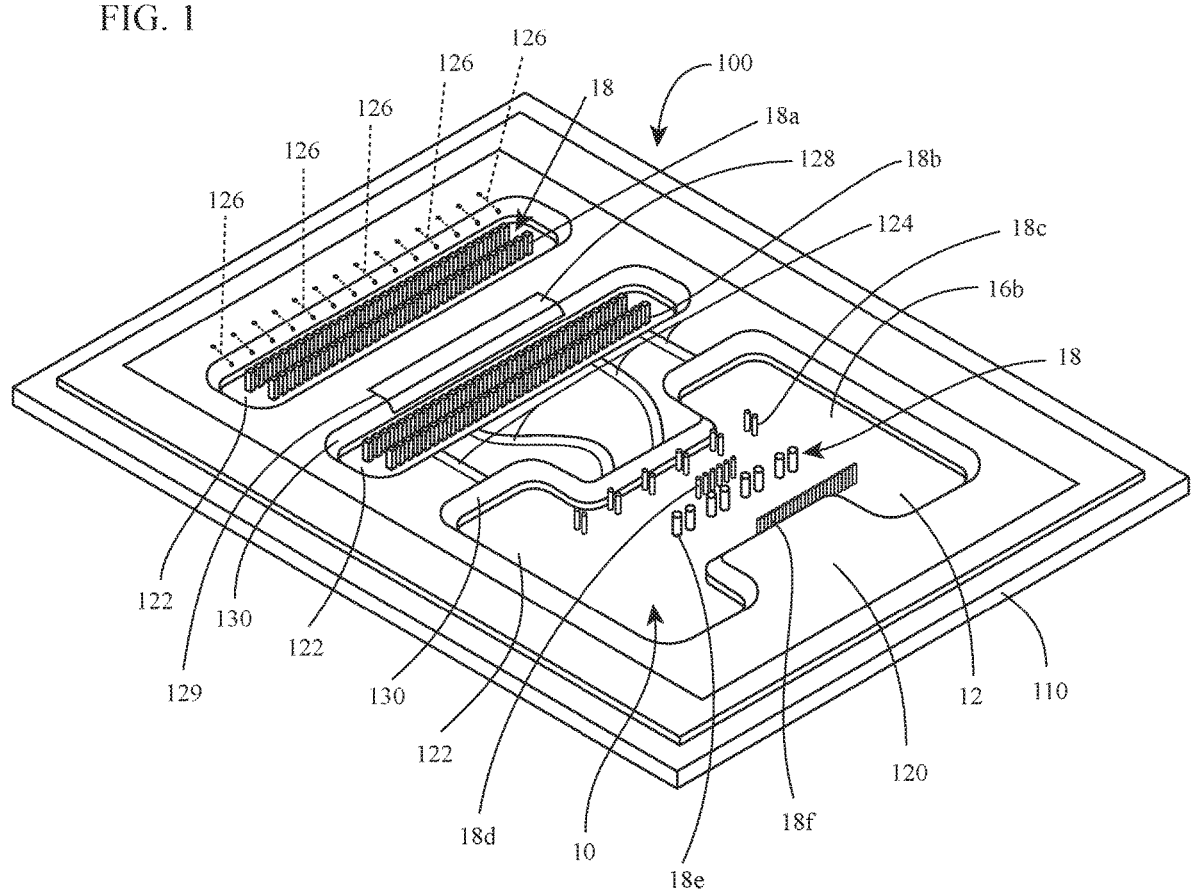
FIG. 1 is a perspective view of the underside of an exemplary PCBA disposed on a wave solder pallet provided in accordance with the present disclosure.
Figure 3:
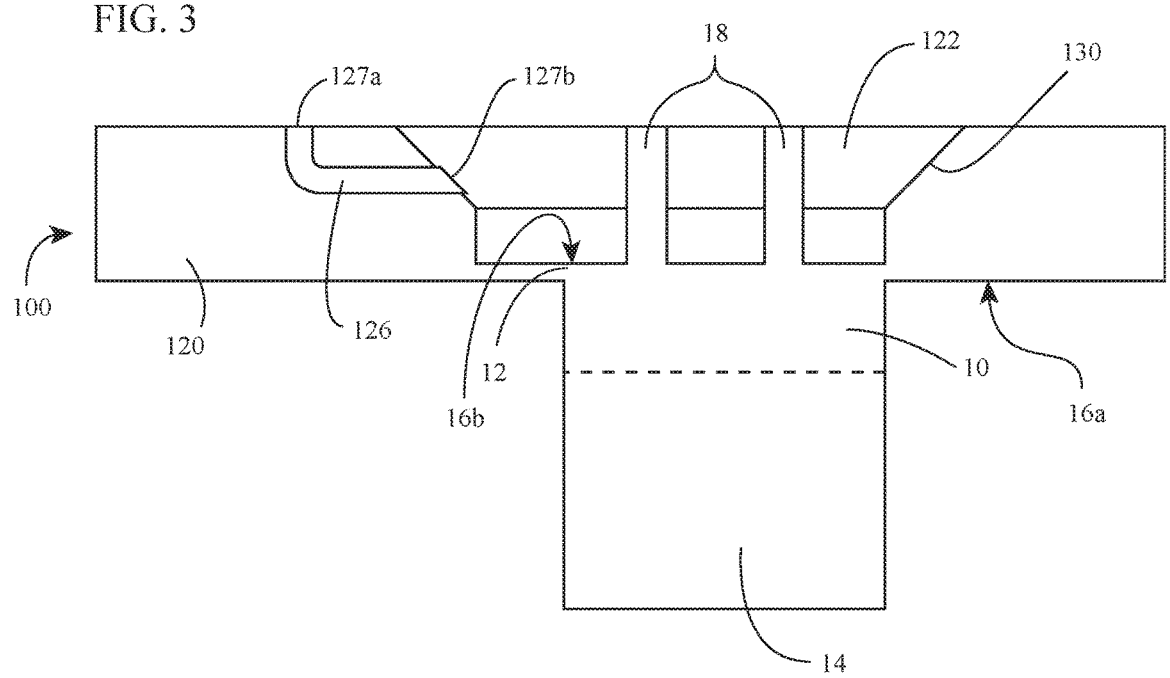
FIG. 3 is a transverse, cross-sectional view of a portion of the PCBA and wave solder pallet of FIG. 1.

Referring to FIG. 1, a Printed Circuit Board Assembly (PCBA) 10 includes a circuit board 12 and a plurality of Pin-Through-Hole (PTH) components 14 (one of the PTH components 14 is illustrated in FIG. 3) disposed on an upper surface 16a (FIG. 3) of circuit board 12. The lead pins 18 of the various PTH components 14 (FIG. 3) extend through holes defined within circuit board 12 and protrude from the lower surface 16b of circuit board 12. The PTH components 14 may include various different lead pins 18, e.g., lead pins 18a, 18b, 18c, 18d, 18e, 18f, arranged in different configurations on the lower surface 16b of circuit board 12. As understood, the various lead pins 18 are soldered to various other lead pins 18 in order to make the desired electrical connections of the PCBA 10. In order to solder the lead pins 18, as described in greater detail below, the PCBA 10 is passed through a wave solder machine 300 (see FIG. 6) and over a standing wave of molten solder 340 (see FIG. 6) such that solder is applied to the underside of the PCBA 10.

In order to ensure that secure and proper connections are achieved via the wave soldering process, and to prevent errors such as solder clogging and uneven soldering, which may result in faulty connections, interfere with the circuit board 12 or other components, and/or damage the circuit board 12 or other components, it is necessary to control solder flow. That is, it is important to control the amount of solder applied from the standing wave of molten solder 340 (see FIG. 6), to control the locations on the underside of the PCBA 10 where solder is applied, and to control the amount of time solder is applied to each of the locations. As can be appreciated, the appropriate amount of solder applied, locations where solder is applied, and amount of time solder is applied varies depending upon the particular lead pins 18a-18f utilized, the number and configuration of connections required, and the configurations of the lead pins 18a-18f relative to one another, the circuit board 12, and other components. Of course, as the number of lead pins 18a-18f increases, the number of connections increases, and/or the configurations of the various lead pins 18a-18f, the circuit board 12, and/or the connections become more complex, the amount of solder applied, the locations where solder is applied, and the amount of time solder is applied are required to be increasingly precisely controlled in order to ensure that secure and proper connections are achieved and errors are prevented.

The amount of solder applied, the locations of solder application, and the duration of solder application are dependent upon the microfluidics of solder flow, e.g., the speed, acceleration, volume, and direction of solder flow. Thus, by controlling the microfluidics of solder flow, application of solder in the appropriate amounts, in the appropriate locations, and for the appropriate durations can be achieved, such that secure and proper connections are achieved and errors inhibited for any suitable configuration of lead pins 18a-18f, circuit boards 12, components, and/or connections. However, as the amount, location, and duration of solder is required to be more precise, e.g., due to an increased number and/or complexity of lead pins 18a-18f and/or connections, as noted above, optimizing the microfluidics of solder flow likewise becomes more important. Indeed, without optimizing the microfluidics of solder flow, complex configurations of PCBA's may not be readily manufacturable.

With continued reference to FIG. 1, PCBA 10 is supported on a pallet 100 including an outer frame 110 and an inner body 120. Pallet 100 is configured to both carry PCBA 10 though a portion of the assembly process, e.g., wave soldering, and to control the microfluidics of solder flow during wave soldering, as detailed below.

Outer frame 110 and inner body 120 may be monolithically formed as a single component of the same material(s), may be formed as separate parts (from the same or different materials) integrally joined with one another, or may be formed as separate parts (from the same or different materials) releasable from one another. Outer frame 110 is configured to be carried, e.g., via conveyor and various machines, throughout at least a portion of the assembly line 200 (see FIG. 5), thereby transporting PCBA 10 along at least a portion of the assembly line 200 (see FIG. 5). Outer frame 110 may be a reusable component or a single-use component and may be formed from 3D printing or other suitable manufacturing process.

Inner body 120 of pallet 100 is configured to support the lower surface 16b of circuit board 12 thereon in abutting relation therewith. More specifically, inner body 120, as detailed below, is designed with various different features specifically configured to control solder flow at the microfluidic level, thereby achieving optimal solder flow, e.g., optimal speed, acceleration, volume, and direction of solder flow, and ensuring that the correct amount of solder is provided in the correct locations for the correct duration.

In order to enable customization of inner body 120 to include almost any geometries and/or features so as to provide inner body 120 with an appropriate configuration for achieving optimal solder flow, inner body 120 is formed via 3D printing, and may be formed from any suitable 3D-printable material, e.g., a high-temperature grade plastic. 3D printing not only reduces costs in that it enables customization of components without the need for tooling or other component-specific manufacturing equipment, but also enables creation of complex geometries and features that are either not possible or cost prohibitive with other manufacturing techniques. Inner body 120 may be printed from a digital model file, e.g., created on a general purpose computer with suitable CAD software.

Continuing with reference to FIG. 1, the various features of inner body 120 are detailed below with respect to FIGS. 2-4B. However, it is understood that these features are merely exemplary, as it is within the scope of the present disclosure that any suitable feature or combination of features be provided to enable creation of an inner body 120 that achieves optimal solder flow e.g., optimal speed, acceleration, volume, and direction of solder flow, for a particular application.

Inner body 120 defines a plurality of openings 122, a plurality of channels 124, a plurality of tunnels 126, and a ramp 128. Openings 122 extend completely through inner body 120 such that openings 122 enable portions of the lower surface 16b of circuit board 12 of PCBA 10, e.g., the portions including lead pins 18, to remain exposed when PCBA 10 is disposed on pallet 100. Openings 122 may be connected to some or all of the other openings 122 or may be isolated from some or all of the other openings 122. Openings 122 may define any suitable size, shape, or orientation, and may receive one or multiple groups of lead pins 18a-18f therein. The interior edges 130 of inner body 120 that define openings 122 may be ramped at any suitable angle, and/or may include portions that extend perpendicularly relative to circuit board 12 of PCBA 10.

Figure 4A:
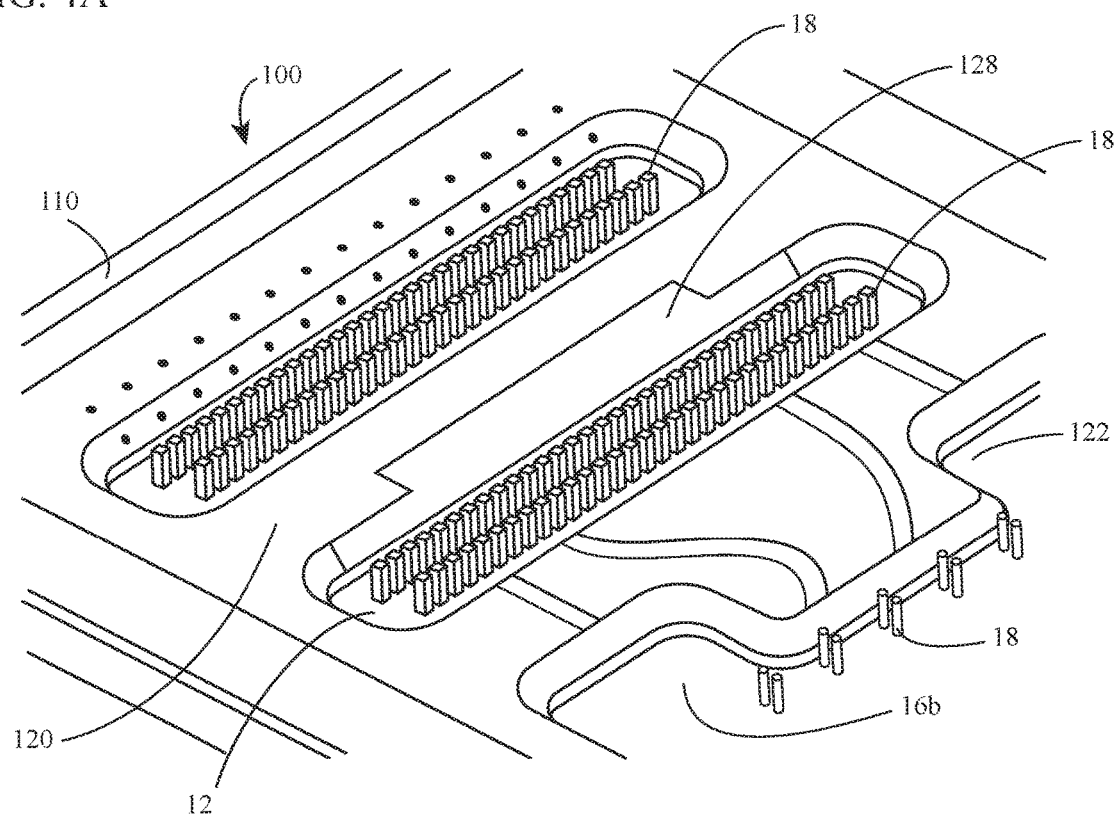
FIG. 4A is an enlarged, perspective view of a portion of the underside of the PCBA and a portion of the wave solder pallet of FIG. 1, wherein the wave solder pallet is in a first configuration.

As best illustrated in FIGS. 1 and 4A, channels 124 are defined within inner body 120 in order to establish discrete flow paths for solder flow. Channels 124 may define any suitable depth, width, or cross-sectional geometry (e.g., V-shaped, U-shaped, W-shaped, etc.), and may define varied depths, widths, and/or cross-sectional geometries along the lengths thereof. Channels 124 may begin and/or terminate at one or more openings 122 and/or may be oriented in any suitable direction, include any suitable curvature(s), and/or define any suitable lengths. As can be appreciated, the number of channels 124 and the particular configuration of each channel 124 is designed to achieve optimal solder flow therethrough to direct the appropriate amount of solder to the appropriate locations for the appropriate duration.

Figure 2:
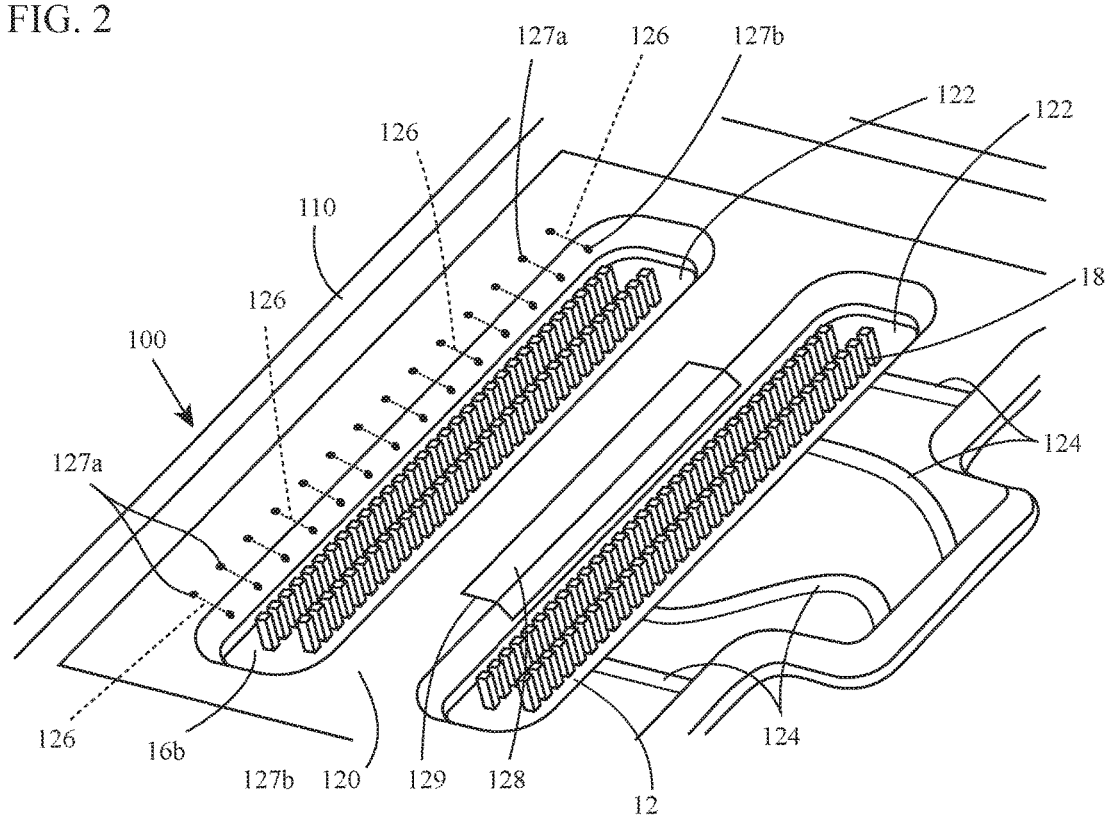
FIG. 2 is an enlarged, perspective view of a portion of the underside of the PCBA and a portion of the wave solder pallet of FIG. 1.

As best illustrated in FIGS. 1-3, tunnels 126 of inner body 120 each include a first open end 127a and a second open end 127b and extend between the first and second open ends 127a, 127b thereof. Tunnels 126 may define any suitable cross-sectional geometry (e.g., circular, polygonal, oval, etc.), and may define varied geometries along the lengths thereof. Tunnels 126 may be fed by and/or feed into one or more openings 122 and/or may be oriented in any suitable 3-dimensional direction, include any suitable 3-dimensional curvature(s), and/or define any suitable lengths. Tunnels 126 are configured to direct solder flow therethrough (e.g., to receive solder at first open ends 127a and direct solder through tunnels 126 and second open ends 127b thereof to the appropriate location(s)). As can be appreciated, the number of tunnels 126 and the particular configuration of each tunnel 126 is designed to achieve optimal solder flow therethrough to direct the appropriate amount of solder to the appropriate locations for the appropriate duration.

Figure 4B:
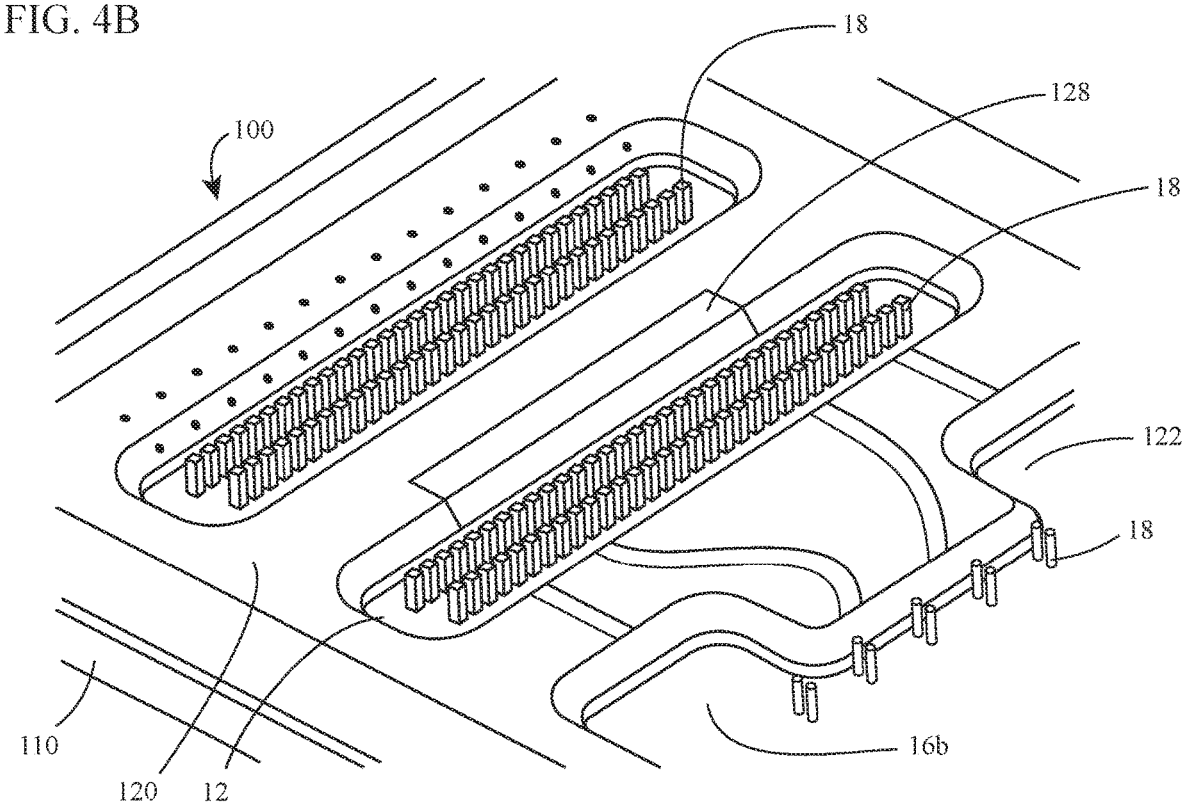
FIG. 4B is an enlarged, perspective view of the portion of the underside of the PCBA and the portion of the wave solder pallet of FIG. 1 as illustrated in FIG. 4A, wherein the wave solder pallet is in a second configuration.

As best illustrated in FIGS. 1 and 4A-4B, ramp 128 of inner body 120 is movably and/or removably seated within a recess 129 defined within inner body 120 to enable ramp 128 to be moved between a plurality of different positions relative to inner body 120 and/or to be replaced with a ramp 128 of a different configuration. As such, ramp 128 enables post-manufacture adjustment of inner body 120 to achieve a configuration designed for optimal solder flow for a particular application. Ramp 128 feeds into one or more of openings 122 to control the solder flow into the one or more openings 122. In embodiments where ramp 128 is movable between a plurality of different positions, ramp 128 and recess 129 may be configured for friction-fit engagement with one another or may define complementary engagement features, e.g., protrusions and detents, in order to enable retention of ramp 128 in a plurality of different positions relative to inner body 120. In each different position, ramp 128 cooperates with the remainder of inner body 120 to define a different contour, e.g., width, length, depth, and/or slope angle, thus altering the solder flow therealong and into the one or more openings 122. As such, ramp 128 may be moved to an appropriate position depending upon the optimal solder flow needed. FIG. 4A illustrates an exemplary configuration representing a first position of ramp 128, wherein ramp 128 and the remainder of inner body 120 cooperate to define a first configuration. FIG. 4B illustrates an exemplary configuration representing a second, different position of ramp 128, wherein ramp 128 and the remainder of inner body 120 cooperate to define a second configuration different from the first configuration such that microfluidics of solder flow in the second configuration are different from that in the first configuration.

In embodiments where ramp 128 is configured to be removed and replaced with a different ramp 128, the ramps 128 and recess 129 may be configured for friction-fit engagement with one another or may define complementary engagement features, e.g., protrusions and detents, in order to enable releasable retention of each ramp 128 within recess 129 of inner body 120. Each different ramp 128 cooperates with the remainder of inner body 120 to define a different contour, e.g., width, length, depth, and/or slope angle, thus altering the solder flow therealong and into the one or more openings 122. As such, a particular ramp 128 may be selected and engaged with inner body 120 depending upon the optimal solder flow needed. FIG. 4A illustrates an exemplary configuration representing a first ramp 128 being engaged with inner body 120, wherein the first ramp 128 and the remainder of inner body 120 cooperate to define a first configuration. FIG. 4B illustrates an exemplary configuration representing a second ramp 128 being engaged with inner body 120, wherein the second ramp 128 and the remainder of inner body 120 cooperate to define a second configuration different from the first configuration such that microfluidics of solder flow in the second configuration are different from that in the first configuration.

Referring generally to FIGS. 1-4B, in addition to features of inner body 120 such as those detailed above, e.g., openings 122, channels 124, tunnels 126, and ramp 128, various different materials or combinations of may be utilized for 3D printing inner body 120 and/or inner body 120 may be 3D printed with various different surface textures to further optimize solder flow.

Figure 5:
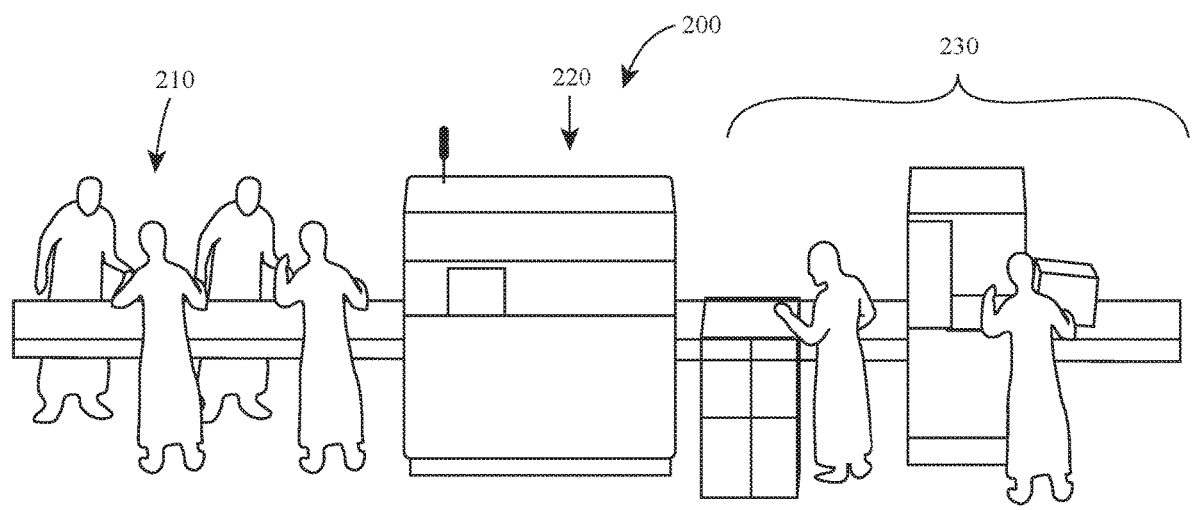
FIG. 5 is a schematic drawing of a portion of an assembly line illustrating a portion of a PCBA manufacturing process flow.

Turning now to FIG. 5, in conjunction with FIG. 1, a portion of an assembly line 200 for the manufacture of PCBAs, e.g., PCBA 10 is illustrated. The portion of assembly line 200 illustrated in FIG. 5 includes a PTH component placement station 210, a wave solder station 220, and additional stations 230; however, it is understood that assembly line 200 may additionally or alternatively include additional stations 230 before or inter-disbursed between the PTH component placement station 210 and the wave solder station 220.

During manufacture of PCBA 10, circuit board 12 is moved to PTH component placement station 210, wherein the PTH components 14 (FIG. 3) are placed on circuit board 12 of PCBA 10 with the lead pins 18 thereof extending through circuit board 12. Next, the circuit board 12, with the PTH components 14 (FIG. 3) disposed thereon, is moved to the wave solder station 220, wherein the PCBA 10 enters wave solder machine 300.

Figure 6:
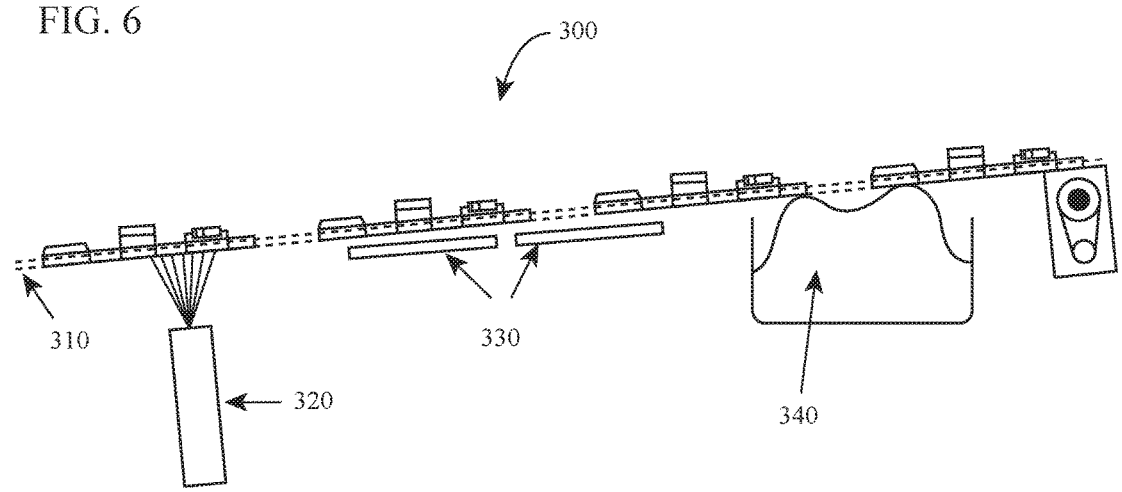
FIG. 6 is a longitudinal, cross-sectional view of the internal operating components of an exemplary wave solder machine.

With additional reference to FIG. 6, in the wave solder machine 300, the PCBA 10 is moved along a conveyor 310 to a fluxer 320, which serves to clean the area that is to be soldered. Next, the PCBA 10 is moved to one or more pre-heaters 330, which serve to pre-heat the PCBA 10 and prevent thermal shock. Thereafter, the PCBA 10 is moved over the upwelling, e.g., standing wave, of molten solder 340. As PCBA 10 is moved over the molten solder 340, the molten solder 340 contacts inner body 120 of pallet 100 and flows therethrough and/or therealong according to the particular configuration of inner body 120, e.g., the number, position, and configurations of openings 122, channels 124, tunnels 126, and/or ramp 128. That is, the various geometries of inner body 120 control the flow of solder, e.g., the speed, acceleration, volume, and direction of solder flow, to lower surface 16*b* of circuit board 12 such that an optimal flow is achieved. The optimal flow is the flow that provides the appropriate amount of solder in the appropriate locations and for the appropriate duration on lower surface 16*b* of circuit board 12 to ensure proper connection of the various lead pins 18 with one another, circuit board 12, and/or other components.

Referring again to FIG. 5, after exiting the wave solder machine 300 and the wave solder station 220 of assembly line 200, the PCBA 10 continues along the assembly line 200 to additional stations 230 to complete the manufacture of the PCBA 10. Pallet 100 may be utilized for none, some, or all of the stations before or after the wave solder station 220.

Figure 7:
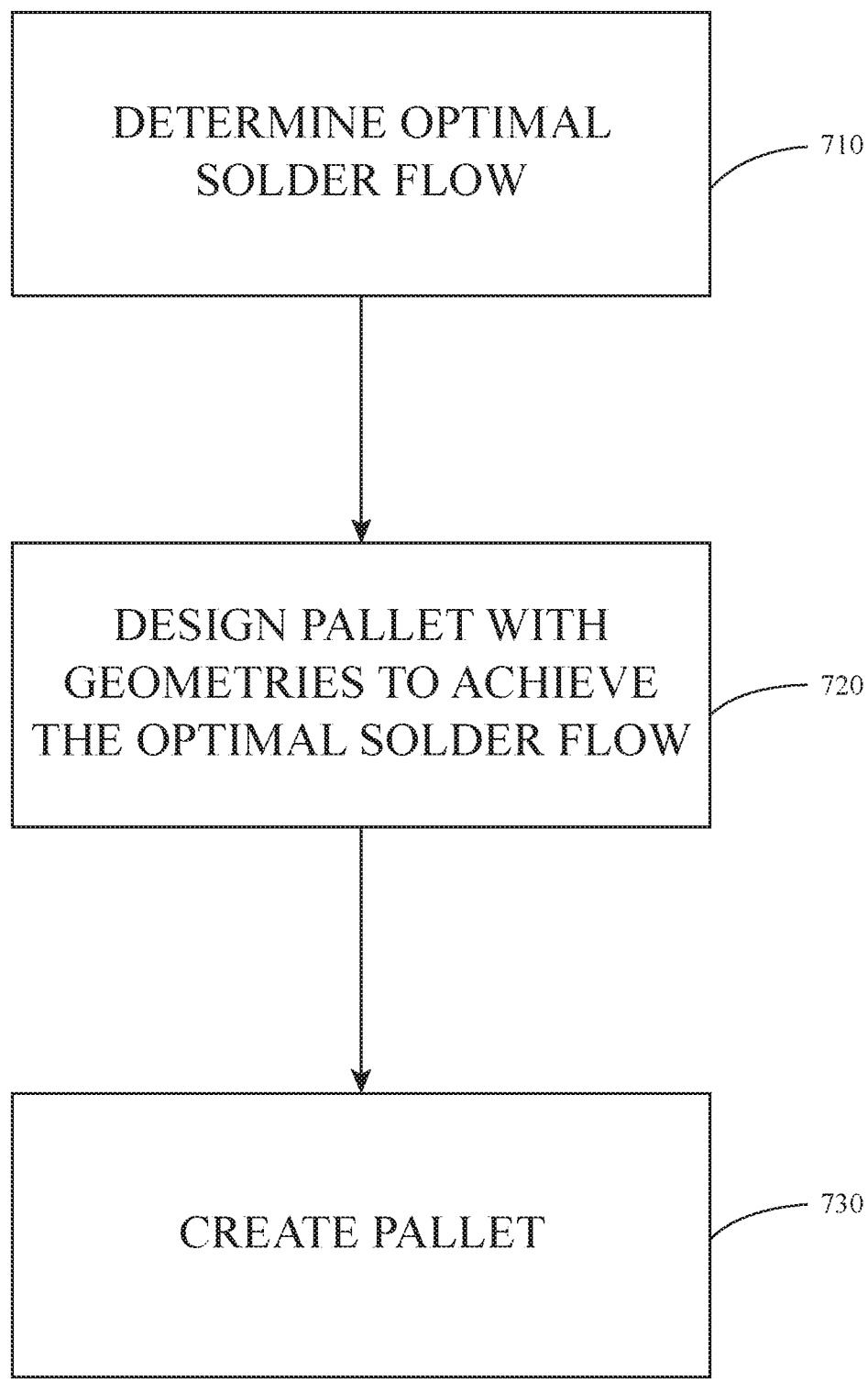
FIG. 7 is a flow diagram illustrating a method of manufacturing a wave solder pallet in accordance with the present disclosure.

With reference to FIG. 7, in conjunction with FIG. 1, as detailed above, pallet 100 is configured to provide optimal solder flow. More specifically, in order to configure pallet 100 to provide optimal solder flow, at step 710, the optimal solder flow is first determined. The optimal solder flow, as noted above, is the solder flow whereby the correct amount of solder is applied in the correct locations and for the correct duration to achieve the desired connections on PCBA 10. As also noted above, the optimal solder flow is determined by taking into account the microfluidics of solder flow, e.g., the speed, acceleration, volume, and direction of solder flow. Commercially-available microfluidics software, running on a general purpose computer, may be utilized to determine the optimal solder flow.

Once the optimal solder flow is determined at step 710, the pallet 100 is designed, at step 720, with appropriate geometries, e.g., the number and configuration of openings 122, channels 124, tunnels 126, and/or ramp 128, that result in optimal solder flow when the pallet 100, supporting PCBA 10 thereof, in passed through wave solder machine 300. That is, the pallet 100 is designed at step 720 such that the correct amount of solder is applied in the correct locations and for the correct duration to achieve the desired connections on PCBA 10. Since at least inner body 120 of pallet 100 is formed from 3D printing, inner body 120 is digitally modeled with suitable CAD software such that the digital model file of inner body 120 may then be analyzed using commercially-available microfluidics software to simulate solder flow therethrough and ensure that the design of inner body 120 indeed provides optimal solder flow. If needed, the design of inner body 120 may then be adjusted in order to provide optimal solder flow. It is understood that the design of inner body 120 at step 720 includes the design of movable and/or replacement components thereof, such as ramp 128, such that these components can be moved and/or replaced post-manufacture in order to provide optimal solder flow.

Continuing with reference to FIG. 7, in conjunction with FIG. 1, at step 730, the pallet 100 is created. For example, the inner body 120 of pallet 100 is 3D printed based upon the digital model file created in step 720. The outer frame 110 of pallet 100 may be formed tougher with the inner body 120 or separately therefrom, as detailed above.

Persons skilled in the art will understand that the structures and methods specifically described herein and shown in the accompanying figures are non-limiting exemplary embodiments, and that the description, disclosure, and figures should be construed merely as exemplary of particular embodiments. It is to be understood, therefore, that the present disclosure is not limited to the precise embodiments described, and that various other changes and modifications may be affected by one skilled in the art without departing from the scope or spirit of the disclosure. Additionally, the elements and features shown or described in connection with certain embodiments may be combined with the elements and features of certain other embodiments without departing from the scope of the present disclosure, and that such modifications and variations are also included within the scope of the present disclosure. Accordingly, the subject matter of the present disclosure is not limited by what has been particularly shown and described.

What is claimed is:

1. A method of manufacturing a printed circuit board assembly, the method comprising:
   providing a circuit board;
   determining a solder flow for the circuit board;
   supporting the circuit board on a pallet, the pallet including an inner body comprising at least one opening for receiving solder flow and geometries to achieve the determined solder flow,
   the geometries of the inner body including one or more of tunnels in fluid communication with a lower surface of the pallet and the at least one opening, a plurality of channels defined through the lower surface of the pallet and in fluid communication with the at least one opening, at least one ramp seated within a recess defined within the inner body, wherein the at least one ramp is in fluid communication with the at least one opening;
   positioning a plurality of components on the circuit board, the plurality of components including a plurality of lead pins extending through the circuit board and protruding from an underside of the circuit board and at least partially through the at least one opening defined within the pallet; and passing the pallet through a wave solder machine such that molten solder contacts the pallet and the geometries of the pallet control the molten solder to flow according to the determined solder flow to establish connections between the plurality of lead pins.

2. The method according to claim 1, wherein the solder flow is determined at least in part based upon microfluidics of solder flow.

3. The method according to claim 1, wherein the solder flow is determined based upon speed, acceleration, volume, and direction of solder flow.

4. The method according to claim 1, wherein the channel interconnects at least two openings defined through the pallet.

5. The method according to claim 1, wherein the geometries of the pallet include at least one ramp configured to be an adjustable component or a replaceable component feeding into one or more of the at least one openings.

\* \* \* \* \*